(12) United States Patent
Kim

(10) Patent No.: US 8,149,636 B2
(45) Date of Patent: Apr. 3, 2012

(54) SEMICONDUCTOR MEMORY DEVICE WITH PULSE WIDTH DETERMINATION

(75) Inventor: Bo-Yeun Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 546 days.

(21) Appl. No.: 12/346,821

(22) Filed: Dec. 30, 2008

(65) Prior Publication Data

US 2009/0323443 A1    Dec. 31, 2009

(30) Foreign Application Priority Data

Jun. 30, 2008    (KR) ............... 10-2008-0063149

(51) Int. Cl.
*G11C 7/00*    (2006.01)

(52) U.S. Cl. ............... 365/193; 365/194; 365/230.06; 365/233.1

(58) Field of Classification Search .......... 365/194, 365/193, 191, 230.06, 233.1, 233.13
See application file for complete search history.

(56) References Cited

U.S. PATENT DOCUMENTS

| | | | |
|---|---|---|---|
| 6,172,919 B1 * | 1/2001 | Horikawa | 365/189.14 |
| 6,552,955 B1 * | 4/2003 | Miki | 365/233.1 |
| 6,564,287 B1 | 5/2003 | Lee | |
| 6,636,446 B2 | 10/2003 | Lee et al. | |
| 7,030,671 B2 * | 4/2006 | Park | 327/172 |
| 7,055,012 B2 | 5/2006 | LaBerge et al. | |
| 7,512,018 B2 * | 3/2009 | Kim | 365/189.02 |
| 7,755,954 B2 * | 7/2010 | Kim | 365/194 |
| 2005/0105363 A1 | 5/2005 | Ko | |
| 2005/0201183 A1 | 9/2005 | Ho | |
| 2007/0247958 A1 * | 10/2007 | Lee | 365/230.06 |
| 2010/0142295 A1 * | 6/2010 | Seo | 365/194 |

FOREIGN PATENT DOCUMENTS

| | | |
|---|---|---|
| JP | 10-149679 | 6/1998 |
| JP | 2002-084176 | 3/2002 |
| KR | 1020000004529 A | 1/2000 |
| KR | 1020050055227 A | 6/2005 |
| KR | 1020060065249 A | 6/2006 |

OTHER PUBLICATIONS

Notice of Preliminary Rejection issued from Korea Intellectual Property Office on Dec. 3, 2009.

* cited by examiner

*Primary Examiner* — Tuan T Nguyen
*Assistant Examiner* — Lance Reidlinger
(74) *Attorney, Agent, or Firm* — IP & T Group LLP

(57) ABSTRACT

A semiconductor memory device includes a reset signal generating unit configured to generate a reset control signal by delaying a column command signal by an amount of time varying proportional to an operational frequency. A pulse width determination unit is configured to determine a pulse width of a column selection signal in response to the column command signal and the reset control signal. An address decoding unit is configured to generate the column selection signal corresponding to a corresponding column address in response to an output signal of the pulse width determination unit.

17 Claims, 4 Drawing Sheets

SEMICONDUCTOR MEMORY DEVICE WITH PULSE WIDTH DETERMINATION

CROSS-REFERENCE TO RELATED APPLICATIONS

The present invention claims priority of Korean patent application number 10-2008-0063149, filed on Jun. 30, 2008, which is incorporated by reference in its entirety.

BACKGROUND OF THE INVENTION

The present invention relates to a semiconductor design technology, and more particularly, to a semiconductor memory device for generating a column selection signal activated in response to a read operation and a write operation.

Generally, a semiconductor memory device such as a Double Data Rate Synchronous Dynamic Random Access Memory (DDR SDRAM) stores or outputs data according to a command required by, i.e., a Central Processing Unit (CPU). If the CPU requires a write operation, data are stored into a memory cell that corresponds to an address inputted from the CPU; if the CPU requires a read operation, data stored in a memory cell that corresponds to an address inputted from the CPU are outputted.

FIG. 1 is a diagram for explaining a general read operation and write operation of a semiconductor memory device. For reference, the semiconductor memory device is designed to include more than tens of millions of memory cells these days. In order to explain conveniently, a single memory cell is illustrated and is referred to as a reference numeral of 110.

The read operation of the semiconductor memory device will be briefly described referring to FIG. 1.

Firstly, if a word line (WL), which is selected by decoding a row address inputted according to an external command signal, is activated, a cell transistor T1 of the memory cell 110 is turned-on and data stored in a cell capacitor C1 are charge-shared to one line of pre-charged bit line pair BL and /BL (a bit line BL in FIG. 1). A bit line BL and a bit line bar /BL have a fine voltage difference through the charge-sharing operation. For the reference, a pre-charged voltage level is half of a voltage level of a core voltage, which is an internal voltage.

Thereafter, a bit line sense amplifying unit 120 senses a fine voltage difference between the bit line BL and the bit line bar /BL which corresponds to the bit line BL and amplifies it. In other words, in case that an electric potential of the bit line BL is higher than that of the bit line bar /BL, the bit line BL is amplified to a pull-up power supply voltage RTO and the bit line bar /BL is amplified to a pull-down power supply voltage SB. On the contrary, in case that the electric potential of the bit line BL is lower than that of the bit line bar /BL, the bit line BL is amplified to the pull-down power supply voltage SB and the bit line bar /BL is amplified to the pull-up power supply voltage RTO.

Meanwhile, if a column selection signal YI, which is selected by decoding a column address inputted according to the external command signal, is activated, a column selection unit 130 is enabled so that the bit line pair BL and /BL are connected to segment input/output line pair SIO and /SIO. That is, the amplified data on the bit line BL are transferred to the segment input/output line SIO and the amplified data on the bit line bar /BL are transferred to the segment input/output line bar /SIO. Herein, the column selection signal YI is a signal that has a predetermined pulse width and will be explained again hereafter.

Thereafter, if an input/output switching unit 140 is enabled in response to an input/output control signal CTR_IO, the segment input/output line pair SIO and /SIO are connected to local input/output line pair LIO and /LIO. That is, the data transferred to the segment input/output line SIO are transferred to the local input/output line LIO and the data transferred to the segment input/output line bar /SIO are transferred to the local input/output line bar /LIO. A read driving unit 150 drives a global input/output line GIO according to the data transferred through the local input/output line pair LIO and /LIO.

As a result, the data stored in the memory cell 110 are amplified at the bit line pare BL and /BL and is transferred to the segment input/output line pair SIO and /SIO. The data transferred to the segment input/output line pair SIO and /SIO are transferred to the local input/output line pair LIO and /LIO in response to the column selection signal YI. And, the data transferred to the local input/output line pair LIO and /LIO are transferred to the global input/output line GIO in response to the input/output control signal CTR_IO. The data transferred in this manner are finally outputted to the outside through a corresponding pad (not shown in the drawing).

Meanwhile, in the write operation, data inputted from the outside are transferred in a reverse direction in comparison with the read operation. That is, the data inputted through a pad are transferred from the global input/output line GIO to the local input/output line pair LIO and /LIO through a write driving unit 160, and from the local input/output line pair LIO and /LIO to the segment input/output line pair SIO and /SIO, and from the segment input/output line pair SIO and /SIO to the bit line bar pair BL and /BL. The data transferred in this manner are finally stored into the memory cell 110.

For reference, an RC loading is reflected to the data transferred through each line by a plurality of resistors R and capacitors C.

FIG. 2 is a block diagram for explaining a construct that participates in the generation of the column selection signal YI. A pulse width determination unit 210, a delay unit 230 and an address decoding unit 250 are shown in the drawing.

The pulse width determination unit 210 generates a pulse determining signal AYP18 and a set control signal SET in response to a read command signal CASP10RD, a write command signal CASP10WT and a reset control signal SETB. Herein, the read command signal CASP10RD is activated in the read operation of the semiconductor memory device, which is defined by an external command signal. The write command signal CASP10WT is activated in the write operation of the semiconductor memory device, which is defined by an external command signal. And, the pulse determining signal AYP18 is activated in response to the read command signal CASP10RD and the write command signal CASP10WT and is deactivated in response to the reset control signal SETB. Continuously, the set control signal SET is activated in response to the read command signal CASP10RD and the write command signal CASP10WT.

The delay unit 230 generates the reset control signal SETB by delaying the set control signal SET for a predetermined time. Herein, the delay unit 230 may designed to include a plurality of capacitors and resistors.

The address decoding unit 250 receives the pulse determining signal AYP18 and a plurality of column address signals ADD<0:N> where the N is a natural number to generate the column selection signal YI. Herein, the column selection signal YI is selected by the column address signal ADD<0:N> and has the same pulse width as the pulse determining signal AYP18. Although only a single column selection signal YI is shown in the drawing for explaining conveniently, actually the column selection signal YI is one of a plurality of signals generated by decoding the column address signal ADD<0:N>.

In other words, the column address signal ADD<0:N> is reflected to the pulse determining signal AYP18 generated by the pulse width determination unit 210 so that the column selection signal YI is generated. Herein, the pulse width of the pulse determining signal AYP18 is described in detail.

The pulse width of the pulse determining signal AYP18 corresponds to the delay time taken in the delay unit 230. That is, the pulse determining signal AYP18 is activated in response to the set control signal SET activated in response to the read command signal CASP10RD and the write command signal CASP10WT and is deactivated in response to the reset control signal SETB which is generated by delaying the set control signal SET for the predetermined time in the delay unit 230. As a result, pulse determining signal AYP18 has the pulse width that corresponds to the delay time taken in the delay unit 230.

Herein, the delay unit 230 is designed to have an appropriate delay time that a designer determines. Therefore, in case of the semiconductor memory device whose delay time is fixed by the designer, the compatibility with an operational frequency of the system is decreased. For reference, the operational frequency is determined according to the system clock, i.e., an external clock CLK of the semiconductor memory device. That is, the semiconductor memory device designed considering a high operational frequency should be used only in a system that has a corresponding operational frequency; likewise, the semiconductor memory device designed considering a low operational frequency should be used only in a system that has a corresponding operational frequency. Of course, it is possible to use the semiconductor memory device designed considering a high operational frequency in the system that has a low operational frequency. However, since the pulse width is shortened unnecessarily, there is the problem of degrading the operational characteristics of the semiconductor memory device.

Furthermore, the delay unit 230 is sensitive to process, voltage and temperature because of characteristics of a circuit for delaying an inputted signal for a predetermined time and outputting the delayed signal. Therefore, even if the delay unit 230 is designed to have the predetermined delay time, the delay time is changed according to the process, voltage and temperature. That is, the pulse width of the pulse determining signal AYP18 is changed, which means that the stability of an operation of the circuit cannot be secured.

SUMMARY OF THE INVENTION

Embodiments of the present invention are directed to providing a semiconductor memory device capable of generating a pulse determining signal whose pulse width corresponds to an operational frequency.

The embodiments of the invention are also directed to providing a semiconductor memory device capable of generating a column selection signal corresponding to a pulse determining signal that has a stable pulse width.

In accordance with an aspect of the invention, there is provided a semiconductor memory device, which includes a reset signal generating unit configured to generate a reset control signal by delaying a column command signal by an amount of time varying propotinal to an operational frequency, a pulse width determination unit configured to determines a pulse width of a column selection signal in response to the column command signal and the reset control signal, and an address decoding unit configured to generate the column selection signal corresponding to a corresponding column address in response to an output signal of the pulse width determination unit.

In accordance with another aspect of the invention, there is provided a semiconductor memory device, which includes a first control signal generating unit configured to generate a first control signal in response to a column command signal, a second control signal generating unit configured to generate a second control signal by delaying the first control signal by an amount of time varying propotional to an operational frequency, a pulse determining signal output unit configured to output a pulse determining signal whose activation period is defined by the first and second control signals and which determines a pulse width of a column selection signal, and a column selection signal generating unit configured to generate the column selection signal corresponding to a corresponding column address in response to the pulse determining signal.

The semiconductor memory device of the invention controls pulse width of a pulse determining signal, which determines a pulse width of a column selection signal, in response to an operational frequency, and it is possible to improve compatibility and optimize optional characteristics of a semiconductor memory device according to the operational frequency. Also, since the pulse width of the column selection signal varies insensitively to a process, voltage, and/or temperature, the circuit of the semiconductor memory device can be operated stably.

DESCRIPTION OF SPECIFIC EMBODIMENTS

Hereinafter, preferred embodiments in accordance with the present invention will be described in detail with reference to the accompanying drawings so that the invention can readily be practiced by those skilled in the art to which the invention pertains.

Figure 1:
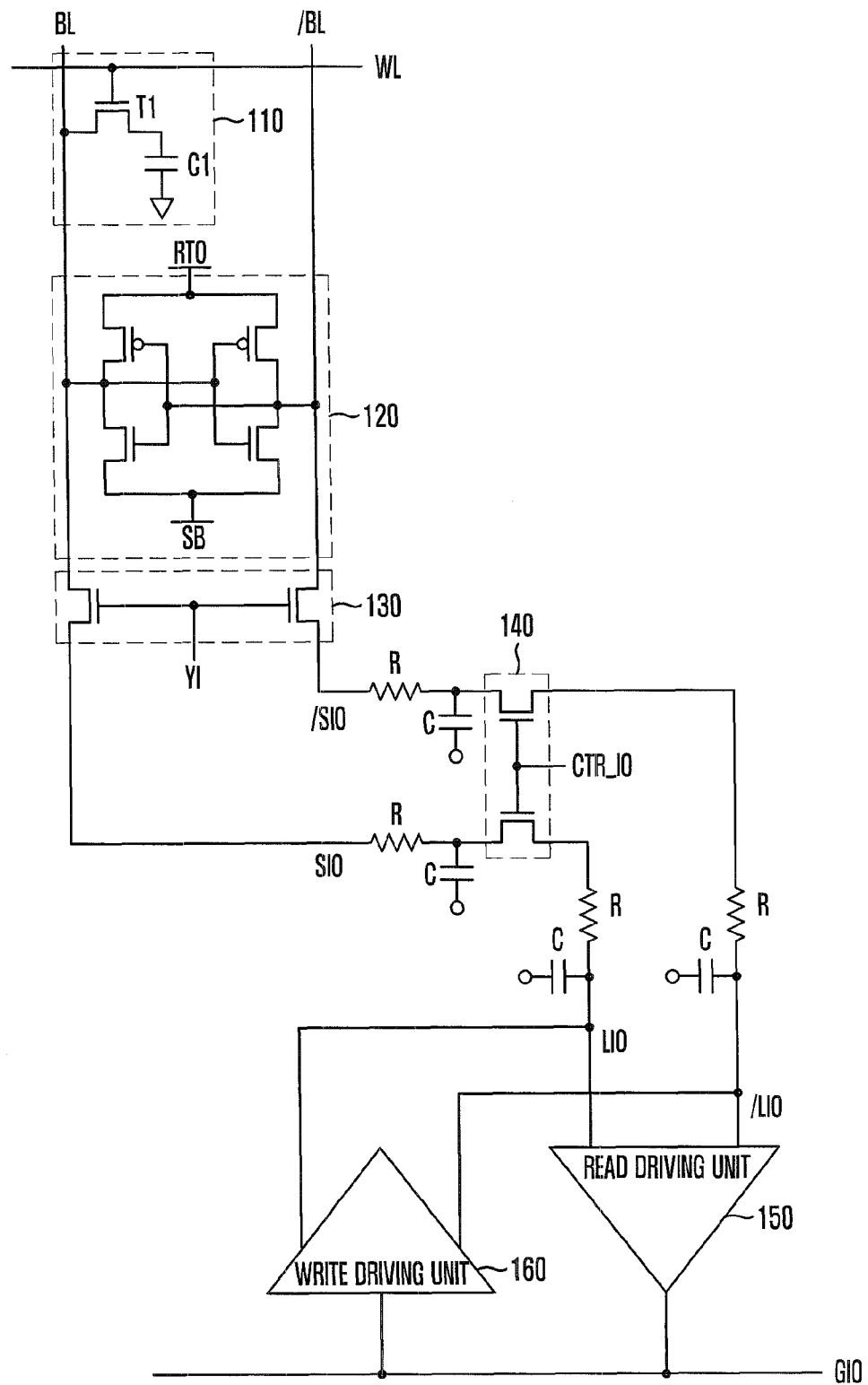
FIG. 1 is a diagram for explaining a general read operation and write operation of a semiconductor memory device.
Figure 2:
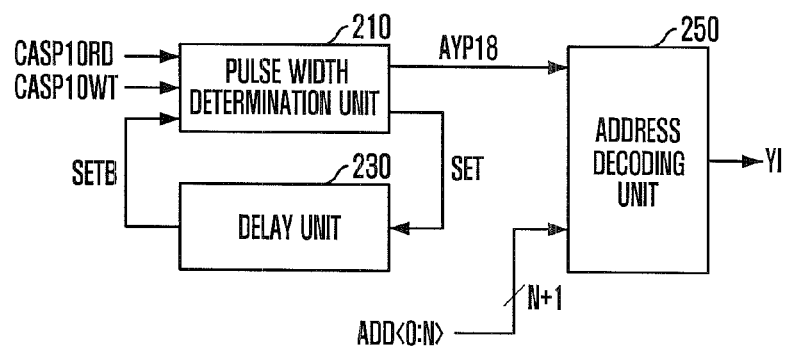
FIG. 2 is a block diagram for explaining a construct that participates in the generation of a column selection signal YI shown in FIG. 1.
Figure 3:
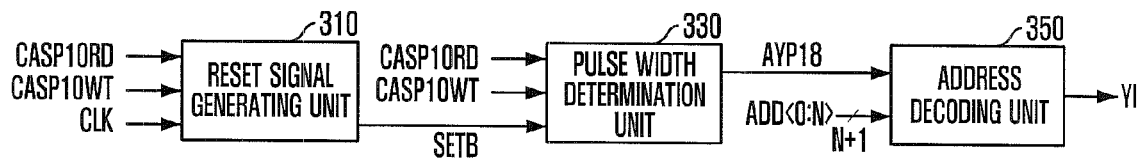
FIG. 3 is a block diagram illustrating a semiconductor memory device in accordance with the present invention.

FIG. 3 is a block diagram illustrating a semiconductor memory device in accordance with the invention. The semiconductor memory device includes a reset signal generating unit 310, a pulse width determination unit 330 and an address decoding unit 350.

The reset signal generating unit 310 receives a read command signal CASP10RD, a write command signal CASP10WT and a clock signal CLK to generate a reset control signal SETB by delaying an activation timing of the read command signal CASP10RD or the write command signal CASP10WT by a delay time which corresponds to a frequency of the clock signal CLK. Herein, the read command signal CASP10RD is a signal activated in the read operation, which is defined according to an external command signal; the write command signal CASP10WT is a signal activated in the write operation, which is defined according to an external command signal; the clock signal CLK may be an external clock of the semiconductor memory device. i.e., the system clock. The read command signal CASP10RD and the write command signal CASP10WT may be classified into a column command signal for activating a column of the semiconductor memory device. And, the clock signal CLK corresponds to an operational frequency of the semiconductor memory device. An external clock signal which is insensitive to process, voltage and temperature may be used as the clock signal CLK.

Figure 4:
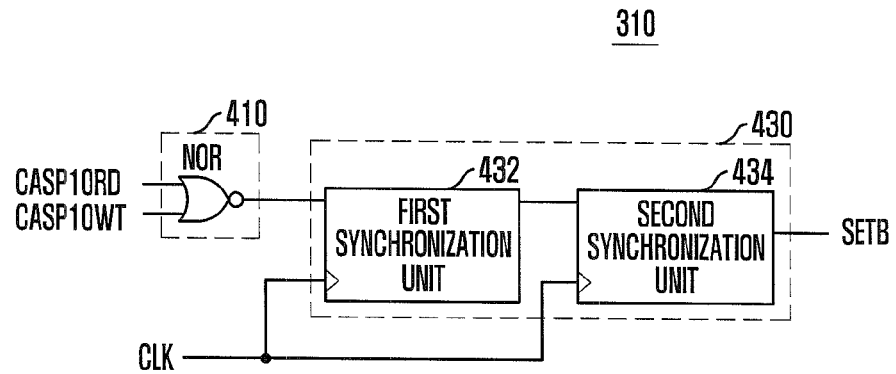
FIG. 4 is a diagram for explaining a reset signal generating unit 310 shown in FIG. 3.

FIG. 4 is a diagram for explaining the reset signal generating unit 310 shown in FIG. 3.

Referring to FIG. 4, the reset signal generating unit 310 may include a command signal input unit 410 and a shifting unit 430.

The command signal input unit 410 serves to generate an output signal which responds to the read command signal CASP10RD and the write command signal CASP10WT and may be provided with a NOR gate for receiving the read command signal CASP10RD and the write command signal CASP10WT. Therefore, if the read command signal CASP10RD is activated from a logic low to a logic high in the read operation, or if the write command signal CASP10WT is activated from a logic low to a logic high in the write operation, an output signal of a logic low may be generated.

The shifting unit 430 serves to generate the reset control signal SETB by shifting the output signal of the command signal input unit 410 according to the clock signal CLK and may be provided with first and second synchronization units 432 and 434. The first synchronization unit 432 may output the output signal of the command signal input unit 410 in response to the clock signal CLK; the second synchronization unit 434 may output the output signal of the first synchronization unit 432 as the reset control signal SETB in response to the clock signal CLK. Herein, the first and second synchronization units 432 and 434 may be designed as, e.g., a D-flip-flop (DFF) circuit capable of outputting each inputted signal in response to the clock signal CLK.

In other words, the output signal of the command signal input unit 410 activated in response to the read command signal CASP10RD and the write command signal CASP10WT is shifted according to the clock signal CLK to be outputted as the reset control signal SETB. Herein, the reset control signal SETB may be the output signal of the command signal input unit 410, which has been shifted twice according to the clock signal CLK. That is, the shifting unit 430 may delay the output signal of the command signal input unit 410 by two periods 2 tCK of the clock signal CLK having a period tCK and output the delayed signal. Although it will be described later, the shifting operation according to the clock signal CLK is directly related to a pulse width of a pulse determining signal AYP18, which may determine a pulse width of a column selection signal YI.

Referring to FIG. 3 again, the pulse width determination unit 330 may generate the pulse determining signal AYP18 whose activation period is defined by the read command signal CASP10RD, the write command signal CASP10WT and the reset control signal SETB and which determines the pulse width of the column selection signal YI. Herein, the pulse determining signal AYP18 is a pulse signal activated in response to the read command signal CASP10RD and the write command signal CASP10WT and deactivated in response to the reset control signal SETB.

Figure 5:
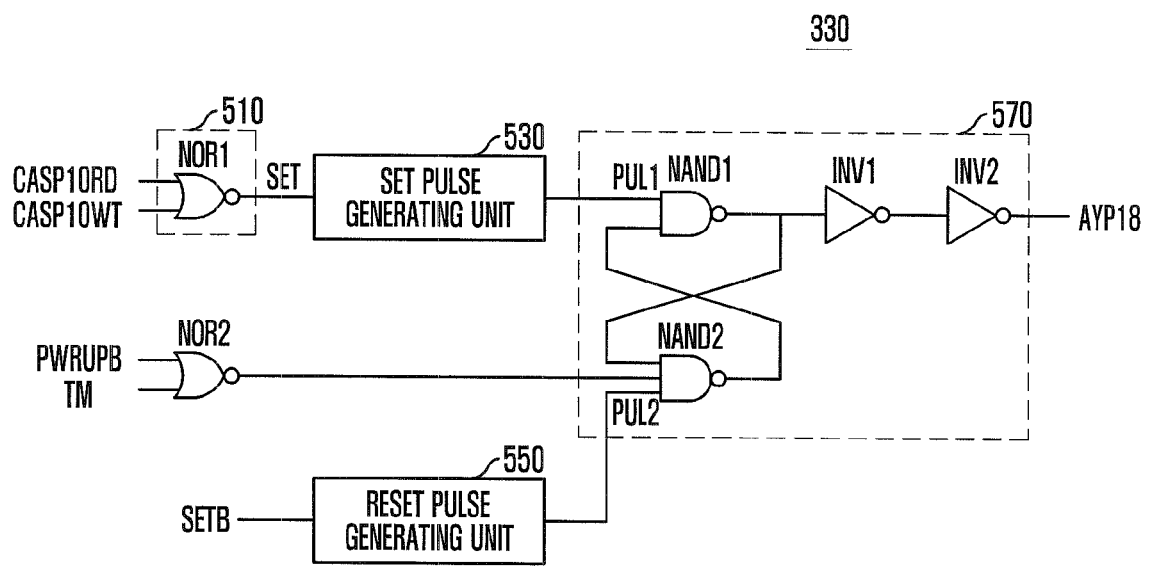
FIG. 5 is a diagram for explaining a pulse width determination unit 330 shown in FIG. 3.

FIG. 5 is a diagram for explaining the pulse width determination unit 330 shown in FIG. 3.

Referring to FIG. 5, the pulse width determination unit 330 may include a set control signal generating unit 510, a set pulse generating unit 530, a reset pulse generating unit 550 and a pulse determining signal output unit 570 and additionally include a second NOR gate NOR2 for generating an output signal which responds to a power-up signal PWRUP and a test mode signal TM. Herein, the power-up signal PWRUP is activated by detecting an external power supply voltage supplied to the semiconductor memory device until the external power supply voltage is increased from an initial voltage level to a stable voltage level. The test mode signal TM serves to reset the pulse determining signal AYP18 at the timing desired by a designer. Particularly, the power-up signal PWRUP may be used for initializing the pulse determining signal output unit 570. Hereafter, explanations will be given on the assumption that both the power-up signal PWRUP and the test mode signal TM are activated to logic low.

The set control signal generating unit 510 serves to generate the set control signal SET in response to the read command signal CASP10RD and the write command signal CASP10WT and may be provided with a first NOR gate NOR1 for receiving the read command signal CASP10RD and the write command signal CASP10WT.

The set pulse generating unit 530 receives the set control signal SET to generate a first pulse signal PUL1 that has a predetermined pulse width. Herein, the set pulse generating unit 530 may be designed as a general pulse generator. In this embodiment, it is explained that the first pulse signal PUL1 has an activation width of a logic low as an example.

The reset pulse generating unit 550 receives the reset control signal SETB to generate a second pulse signal PUL2 that has a predetermined pulse width. Herein, similarly to the set pulse generating unit 530, the reset pulse generating unit 550 may be designed as a general pulse generator. Like the first pulse signal PUL1, it is explained that the second pulse signal PUL2 has an activation width of a logic low as an example.

The pulse determining signal output unit 570 serves to generate the pulse determining signal AYP18 whose pulse width corresponds to the first pulse signal PUL1 and the second pulse signal PUL2. The pulse determining signal output unit 570 may include first and second NAND gates NAND1 and NAND2. The first NAND gate NAND1 receives the first pulse signal PUL1 and an output signal of the second NAND gate NAND2, and the second NAND gate NAND2 receives an output signal of the first NAND gate NAND1 and the second pulse signal PUL2. First and second inverters INV1 and INV2 are further provided to receive the output signal of the first NAND gate NAND1 and output the received signal as the pulse determining signal AYP18.

Hereafter, operations of the invention are described referring to FIGS. 3 to 5.

Firstly, if the column command signal such as the read command signal CASP10RD and the write command signal CASP10WT is activated as a logic high in FIG. 5, the set control signal SET is changed to a logic low. Thereafter, the set pulse generating unit 530 generates the first pulse signal PUL1 which has a predetermined pulse width of a logic low in response to the set control signal SET. Accordingly, the pulse determining signal AYP18 of the pulse determining signal output unit 570 may be changed to a logic high.

Meanwhile, if the column command signal is activated as a logic high in FIG. 4, the output signal of the command signal input unit 410 is changed to a logic low and the shifting unit 430 performs the shifting operation in response to the clock signal CLK. That is, the twice shifted version of the output signal of the command signal input unit 410 becomes the reset control signal SETB.

Thereafter, the reset pulse generating unit 550 generates the second pulse signal PUL2 which has a predetermined pulse width of a logic low in FIG. 5 in response to the reset control signal SETB. Accordingly, the pulse determining signal AYP18 of the pulse determining signal output unit 570 may be changed to a logic low.

That is, the pulse determining signal AYP18 may be changed to a logic high in response to the set control signal SET and may be changed to a logic low in response to the reset control signal SETB generated after twice performing the shifting operation based on the clock signal CLK. In other words, the pulse determining signal AYP18 in accordance with the invention has the pulse width that corresponds to the two shifting actions based on the clock signal CLK. As above-mentioned, since the clock signal CLK corresponds to the operational frequency, as a result, the pulse width of the pulse determining signal AYP18 may be set based on the operational frequency.

Referring to FIG. 3 again, the address decoding unit 350 receives the pulse determining signal AYP18 and a plurality of column address signals ADD<0:N> where the N is a natural number to generate the column selection signal YI. Herein, the column selection signal YI is selected by the column address signal ADD<0:N> and has the same pulse width as the pulse determining signal AYP18. Although only one column selection signal YI is illustrated in the drawing for plain explanations, actually, the column selection signal YI is one of a plurality of signals generated by decoding the column address signal ADD<0:N> and corresponding to the decode.

Figure 6:
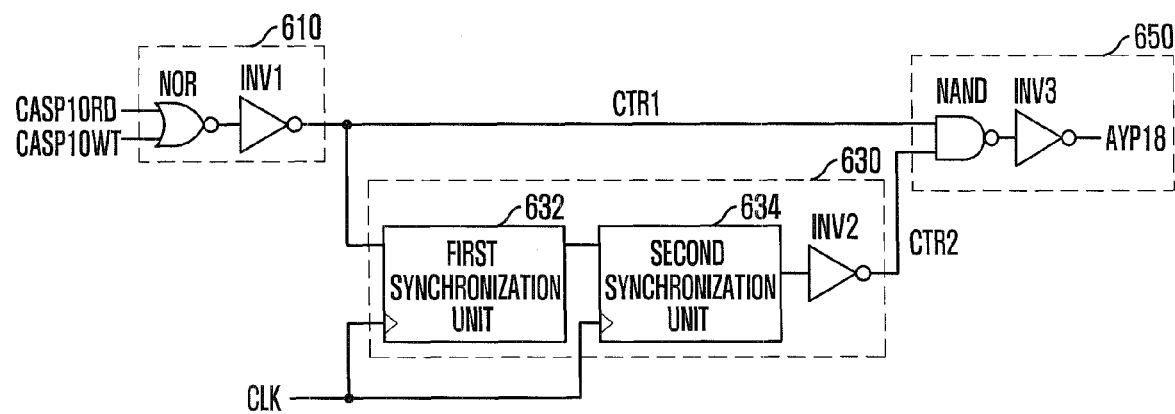
FIG. 6 is a diagram for explaining a semiconductor memory device in accordance with another embodiment of the invention.

FIG. 6 is a diagram for explaining a semiconductor memory device in accordance with another embodiment of the invention.

Referring to FIG. 6, the semiconductor memory device may include a first control signal generating unit 610, a second control signal generating unit 630 and a pulse determining signal output unit 650. For plain explanations, the substantially same address decoding unit as FIG. 3 is not illustrated.

The first control signal generating unit 610 serves to generate a first control signal CTR1 in response to the read command signal CASP10RD and the write command signal CASP10WT. The first control signal generating unit 610 may be provided with a NOR gate NOR for receiving the read command signal CASP10RD and the write command signal CASP10WT and a first inverter INV1 for receiving an output signal of the NOR gate NOR and generating the first control signal CTR1.

The second control signal generating unit 630 serves to generate a second control signal CTR2 by delaying the first control signal CTR1 for a delay time that corresponds to the clock signal CLK. The second control signal generating unit 630 may be provided with a first synchronization unit 632, a second synchronization unit 634 and a second inverter INV2. Herein, the first synchronization unit 632 may shift the first control signal CTR1 in response to the clock signal CLK, and the second synchronization unit 634 may shift an output signal of the first synchronization unit 632 in response to the clock signal CLK. The first and second synchronization units 632 and 634 may be an important factor which determines the pulse width of the pulse determining signal AYP18.

The pulse determining signal output unit 650 serves to output the pulse determining signal AYP10 whose activation period is defined by the first and second control signals CTR1 and CTR2 and which determines the pulse width of the column selection signal YI (not shown in the drawing). The pulse determining signal output unit 650 may be provided with a NAND gate NAND for receiving the first and second control signals CTR1 and CTR2 and a third inverter INV2 for receiving an output signal of the NAND gate NAND and generating the pulse determining signal AYP18.

Hereafter, operations of the semiconductor memory device in accordance with the other embodiment of the invention are briefly described.

Firstly, if the column command signal such as the read command signal CASP10RD or the write command signal CASP10WT is activated, the first control signal CTR1 is activated and the pulse determining signal AYP18 is also activated. Meanwhile, the first control signal CTR1 is shifted in the shifting unit 630 in response to the clock signal CLK, and thereafter, if the second control signal CTR2 is activated through the shifting operation, the pulse determining signal AYP18 is deactivated. As a result, the pulse determining signal AYP18 may have the pulse width that corresponds to the clock signal CLK.

As above-mentioned, since the pulse determining signal AYP18 has the pulse width that corresponds to the operational frequency of the semiconductor memory device, the column selection signal YI has the pulse width that corresponds to the operational frequency of the semiconductor memory device also. Therefore, the semiconductor memory device in accordance with the invention may generate the column selection signal YI that has an each corresponding pulse width in a system of a high operational frequency or low operational frequency. That is, since the semiconductor memory device in accordance with the invention may flexibly adjust the pulse width of the column selection signal YI according to the operational frequency used in a system, the operational characteristics of the semiconductor memory device may be optimized and the compatibility may be improved. Furthermore, since the pulse width of the column selection signal YI is controlled through the shifting operation in response to the clock signal CLK, it is insensitive to process, voltage and temperature, and thus the stability of an operation of a circuit may be secured.

In addition, in case of the delaying circuit for determining the pulse width in the conventional semiconductor memory device, since it is constructed with comparatively large sized elements such as a resistor and a capacitor, there is a considerable burden of layout. However, since the semiconductor memory device in accordance with the invention does not use the conventional delaying circuit, there is an effect of reducing the burden of layout.

The invention generates the column selection signal whose pulse width corresponds to the operational frequency, therefore the effect of securing the compatibility of the semiconductor memory device and the stable circuit operation may be secured.

While the invention has been described with respect to the specific embodiments, it will be apparent to those skilled in the art that various changes and modifications may be made without departing from the spirit and scope of the invention as defined in the following claims.

In addition, although it has been exemplified that the shifting unit is constructed with two D-flip-flops in the above-mentioned embodiments, the invention also may be adopted to the case of using more or less than two D-flip-flops according to a design. Furthermore, besides the D-flip-flop, an element capable of reflecting the delay amount that corresponds to the operational frequency may be used.

Furthermore, the position and type of the logic gates and transistors exemplified in the above-mentioned embodiment should be modified according to polarity of an inputted signal.

What is claimed is:

1. A semiconductor memory device, comprising:
   a reset signal generating unit configured to generate a reset control signal by delaying a column command signal by an amount of time varying proportional to an operational frequency;
   a pulse width determination unit configured to determine a pulse width of a column selection signal in response to the column command signal and the reset control signal; and
   an address decoding unit configured to generate the column selection signal corresponding to a corresponding column address in response to an output signal of the pulse width determination unit,
   wherein the reset signal generating unit includes:
      a command signal input unit configured to receive the column command signal; and
      a shifting unit configured to generate the reset control signal by shifting an output signal of the command signal input unit according to a clock signal.

2. The semiconductor memory device of claim 1, wherein an output signal of the pulse width determination unit has an activation period defined by the column command signal and the reset control signal and determines the pulse width of the column selection signal.

3. The semiconductor memory device of claim 2, wherein the output signal of the pulse width determination unit is activated in response to the column command signal and is deactivated in response to the reset control signal.

4. The semiconductor memory device of claim 1, wherein the clock signal is an external clock signal determining the operational frequency.

5. The semiconductor memory device of claim 4, wherein the shifting unit delays the output signal of the command signal input unit by twice a period of the external clock signal to output the delayed signal.

6. The semiconductor memory device of claim 1 wherein the shifting unit includes a plurality of synchronization units configured to output signals inputted to each synchronization unit in response to the clock signal.

7. The semiconductor memory device of claim 1, wherein the pulse width determination unit includes:
   a set control signal generating unit configured to generate a set control signal in response to the column command signal;
   a set pulse generating unit configured to generate a set pulse signal having a predetermined pulse width in response to the set control signal;
   a reset pulse generating unit configured to generate a reset pulse signal having a predetermined pulse width in response to the reset control signal; and
   a pulse determining signal output unit configured to output a pulse determining signal in response to the set pulse signal and the reset pulse signal.

8. The semiconductor memory device of claim 7, wherein the pulse determining signal is activated in response to the set pulse signal and is deactivated in response to the reset pulse signal.

9. The semiconductor memory device of claim 7, wherein the pulse determining signal output unit is initialized in response to a power-up signal activated by detecting an external power supply voltage.

10. The semiconductor memory device of claim 7, wherein the column selection signal has the same pulse width as the pulse determining signal.

11. The semiconductor memory device of claim 7, wherein the column selection signal is generated by using the corresponding column address to and the pulse determining signal.

12. A semiconductor memory device, comprising:
   a first control signal generating unit configured to generate a first control signal in response to a column command signal;
   a second control signal generating unit configured to generate a second control signal by delaying the first control signal by an amount of time varying proportional to an operational frequency;
   a pulse determining signal output unit configured to output a pulse determining signal whose activation period is defined by the first and second control signals and which determines a pulse width of a column selection signal; and
   a column selection signal generating unit configured to generate the column selection signal corresponding to a corresponding column address in response to the pulse determining signal,
   wherein the second control signal generating unit includes a plurality of synchronization units configured to generate the second control signal by shifting the first control signal according to a clock signal.

13. The semiconductor memory device of claim 12, wherein the clock signal is an external clock signal determining the operational frequency.

14. The semiconductor memory device of claim 13, wherein the second control signal generating unit delays the first control signal by twice a period of the external clock signal to output the delayed signal.

15. The semiconductor memory device of claim 12, wherein the pulse determining signal is activated in response to the first control signal and is deactivated in response to the second control signal.

16. The semiconductor memory device of claim 12, wherein the column selection signal has the same pulse width as the pulse determining signal.

17. The semiconductor memory device of claim 12, wherein the column selection signal is generated by using the corresponding column address to and the pulse determining signal.

* * * * *